United States Patent
Kim

(10) Patent No.: US 8,446,778 B2
(45) Date of Patent: May 21, 2013

(54) METHOD FOR OPERATING A FLASH MEMORY DEVICE

(75) Inventor: Se Jun Kim, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 709 days.

(21) Appl. No.: 12/650,787

(22) Filed: Dec. 31, 2009

(65) Prior Publication Data

US 2010/0172185 A1 Jul. 8, 2010

(30) Foreign Application Priority Data

Jan. 6, 2009 (KR) .......................... 10-2009-0000913

(51) Int. Cl.
*G11C 11/34* (2006.01)

(52) U.S. Cl.
USPC ................................. 365/185.28; 365/185.14

(58) Field of Classification Search
USPC ............................ 365/185.14, 185.19, 185.28
See application file for complete search history.

(56) References Cited

U.S. PATENT DOCUMENTS

| | | | |
|---|---|---|---|
| 2006/0291290 A1* | 12/2006 | Kim et al. | 365/185.22 |
| 2007/0053222 A1 | 3/2007 | Niset et al. | |
| 2007/0189070 A1 | 8/2007 | Tanaka et al. | |
| 2008/0158989 A1* | 7/2008 | Wan et al. | 365/185.22 |

FOREIGN PATENT DOCUMENTS

KR 10-2009-0000407 1/2009

* cited by examiner

*Primary Examiner* — Anthan Tran
(74) *Attorney, Agent, or Firm* — Marshall, Gerstein & Borun LLP

(57) ABSTRACT

A charge trap flash memory device is capable of preventing a data retention fail by ensuring a data retention margin. A method for operating the charge trap flash memory device is provided. A selected memory cell is programmed using a program voltage. The selected memory cell is verified using a first program verify voltage. Date retention states of selected memory cell having passed the program verify step are verified using a retention verify voltage. A read step of determining a program pass or fail by reading data of the selected memory cell having passed the retention verify step is performed using a read voltage.

14 Claims, 5 Drawing Sheets

METHOD FOR OPERATING A FLASH MEMORY DEVICE

CROSS-REFERENCE TO RELATED APPLICATIONS

Priority to Korean application number 10-2009-0000913 filed on Jan. 6, 2009, the entire disclosure of which is incorporated by reference in its entirety is claimed.

BACKGROUND

The disclosure generally relates to a flash memory device, and, more particularly, to a method for operating a charge trap flash memory device.

In order to prevent mutual interference between adjacent memory cells, a charge trap flash memory having a new cell structure has been developed which performs a program operation and an erase operation by using a charge trapping layer, instead of a floating gate. A charge trap flash memory device having a silicon-oxide-nitride-oxide-silicon (SONOS) or metal-alumina-nitride-oxide-silicon (MANOS) structure, which is widely used as a charge trapping element, includes a tunneling layer, a charge trapping layer, a blocking layer, and a control gate electrode, which are sequentially formed over a substrate with a channel region.

FIG. 1 illustrates a cross-sectional view of a typical flash memory device having a charge trapping layer.

Referring to FIG. 1, a tunneling layer 110 is formed over a substrate 100, such as a silicon (Si) substrate. The tunneling layer 110 is formed as an oxide film. Impurity regions 102, such as source/drain regions, are disposed in the substrate 100 and spaced apart from each other by a predetermined distance. A channel region 104 is disposed between the impurity regions 102. A silicon nitride film used as a charge trapping layer 120 is formed over the tunneling layer 110. An insulation film used as a blocking layer 130, and a control gate electrode 140 are sequentially disposed over the charge trapping layer 120.

A program operation is performed by positively charging the control gate electrode 140 and applying an appropriate bias to the impurity regions 102. Hot electrons from the substrate 100 are trapped in trap sites inside the charge trapping layer 120. In this way, a memory cell is programmed. On the other hand, an erase operation is performed by negatively charging the control gate electrode 140 and applying an appropriate bias to the impurity regions 102. Holes from the substrate 100 are trapped in trap sites inside the charge trapping layer 120. The holes trapped in the charge trapping layer 120 are recombined with extra electrons. In this way, a memory cell is erased.

In such a flash memory device having the SONOS or MANOS structure, after electric charges are injected into the silicon nitride film used as the charge trapping layer 120 in order to program the memory cell, the injected electric charges may be lost through the tunneling layer 110 or the blocking layer 130. An electric charge retention characteristic which represents an ability to retain electric charges trapped in the charge trapping layer 120 for a long time largely depends on characteristics of the silicon nitride film used as the charge trapping layer 120. Therefore, it may be one of the most important factors among data retention characteristics to control the electric charge retention characteristic of the silicon nitride film.

The improvement in data retention characteristics of the charge trap flash memory device may be achieved by improving the electric charge retention characteristic of an ONO stack structure in a fabrication process, for example, by improving the characteristics of the silicon nitride film or improving the leakage current characteristic of the tunneling layer or the blocking layer. In addition to those methods, the improvement in data retention characteristics of the charge trap flash memory device may be achieved by improving a data retention margin through an electrical operation of memory cells. Generally, in programming flash memory cells, the program operation is followed by a program verify operation at a predetermined threshold voltage (Vt) level. After the program operation, a program pass or fail is determined with reference to a read line, which is relatively lower than a program verify voltage.

FIG. 2 illustrates an energy distribution of trap sites included in a silicon nitride film used as a charge trapping layer.

The silicon nitride film used as the charge trapping layer has characteristics of an insulation film, and includes a large number of traps capable of trapping electric charges therein. The traps inside the silicon nitride film are distributed randomly and exhibit a certain range of energy level distribution as illustrated in FIG. 2. Although the silicon nitride film includes a plurality of traps 210 with a relatively high energy level, it also includes traps 220 with a relatively low energy level. The traps 220 with a relatively low energy level trap electric charges through the program and erase operations of the flash memory device, and then the trapped electric charges are easily detrapped or released as a certain time elapses. Consequently, as illustrated in FIG. 3, a threshold voltage of a memory cell is greatly lowered.

FIG. 3 illustrates a variation in a threshold voltage of a memory cell due to loss of electric charges in a charge trap flash memory device.

Since the electric charges trapped in the charge trapping layer by the program operation are detrapped with the elapse of time, the threshold voltage of the memory cell is gradually lowered from a threshold voltage 310 which is given when the memory cell is programmed. Typically, the initial reduction width of the threshold voltage is greatest, and the threshold voltage is gradually lowered with the elapse of time. When the threshold voltage becomes lower than a voltage of a read line, the corresponding memory cell is determined as an unprogrammed memory cell in the read operation. Consequently, a data retention fail may increase.

SUMMARY

Examples of a method for operating a charge trap flash memory device, which is capable of preventing a data retention fail, are disclosed herein.

In one aspect, a method for operating a charge trap flash memory device includes programming a selected memory cell using a program voltage, verifying the selected memory cell using a first program verify voltage, verifying date retention states of the selected memory cell using a retention verify voltage when the verifying is passed, reading a cell data of the selected memory cell when the verifying data retention states is passed and determining a program pass or fail of the selected memory cell.

In another aspect, a method for operating a charge trap flash memory device includes programming a selected memory cell using a program voltage, verifying the selected memory cell using a first program verify voltage, verifying date retention states of the selected memory cell using a retention verify voltage when the verifying is passed, reprogramming the selected memory cell having failed the retention verify step, verifying the reprogrammed memory cell using a second program verify voltage, reading a cell data of the reprogrammed memory cell when the verifying data retention states is passed, reading a cell data of the selected memory cell when the second verifying the reprogrammed selected memory cells is passed and determining a program pass or fail of the selected memory cell.

DETAILED DESCRIPTION

Hereinafter, examples of a method for operating a charge trap flash memory device, which is capable of preventing a data retention fail, will be described in detail with reference to the accompanying drawings.

In one example, an appropriate threshold voltage level between a cell program verification line and a read line is set, and an appropriate program bias is applied to a memory cell whose threshold voltage is lowered below the set threshold voltage level. In this way, the memory cell is reprogrammed to have a threshold voltage higher than the cell program verification line. Consequently, a data retention margin may be ensured, and a data retention fail may be prevented.

Figure 1:
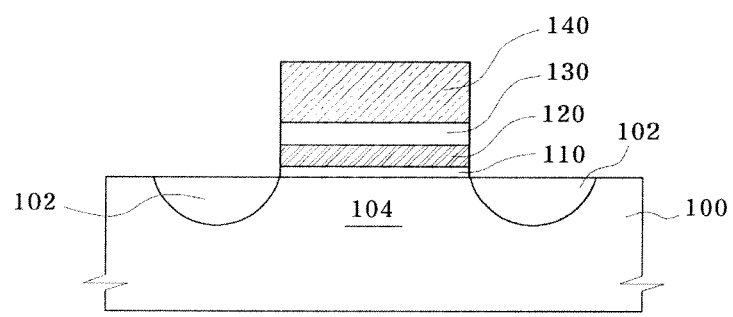
FIG. 1 illustrates a cross-sectional view of a typical prior art flash memory device having a charge trapping layer.
Figure 2:
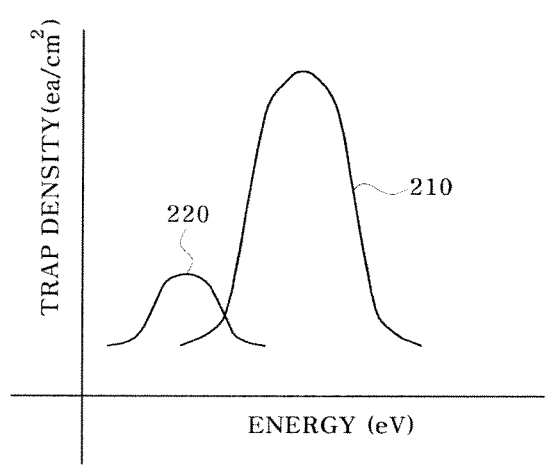
FIG. 2 illustrates an energy distribution of trap sites included in a silicon nitride used as a charge trapping layer of a typical prior art flash memory device.
Figure 3:
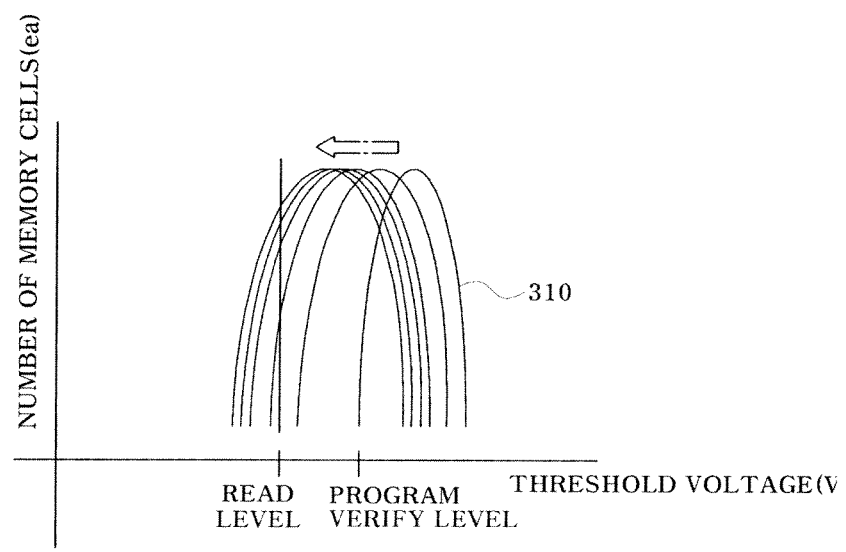
FIG. 3 illustrates a variation in a threshold voltage of a memory cell due to loss of electric charges in a typical prior art charge trap flash memory device.
Figure 4:
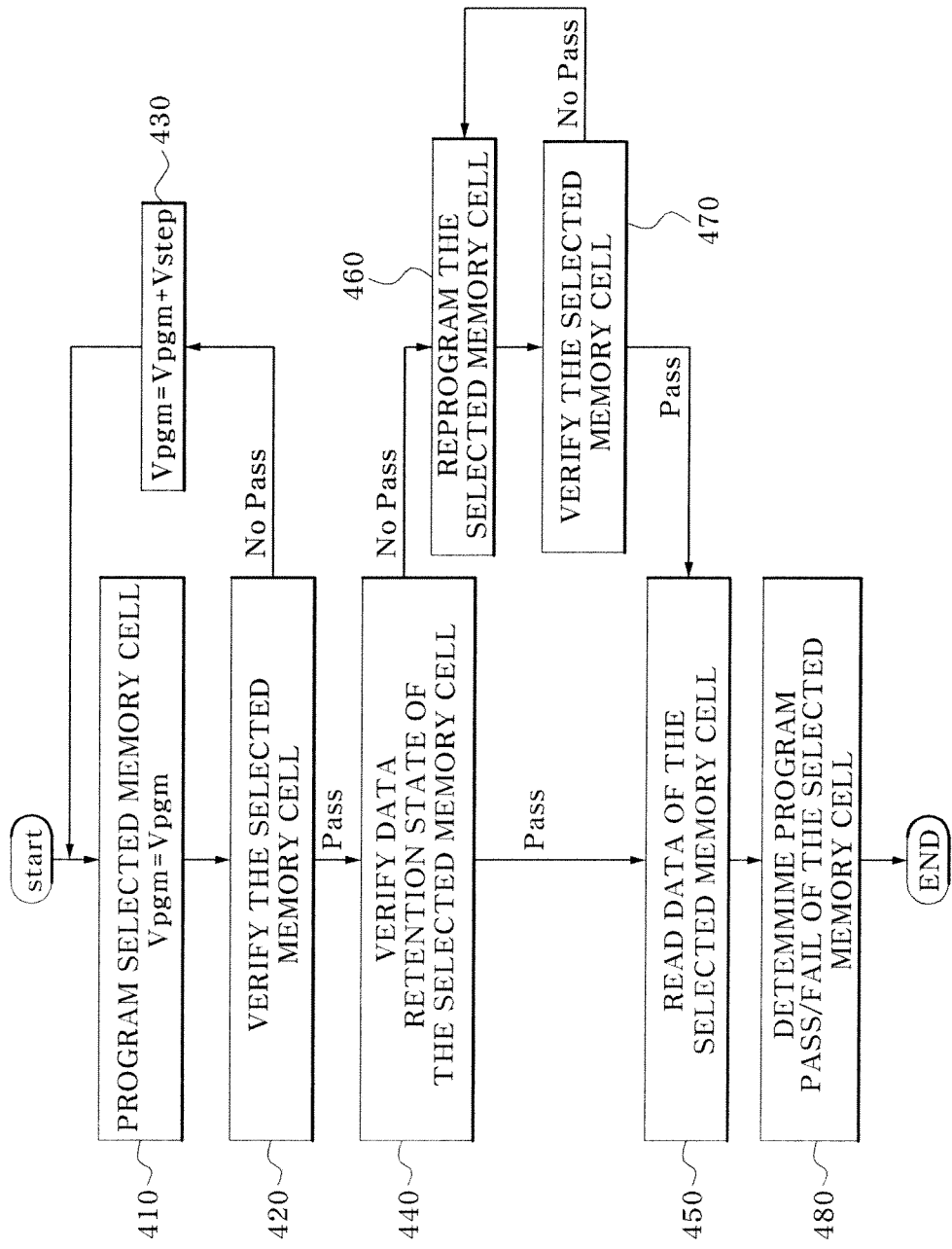
FIG. 4 illustrates a flowchart of a method for operating a charge trap flash memory device.
Figure 5:
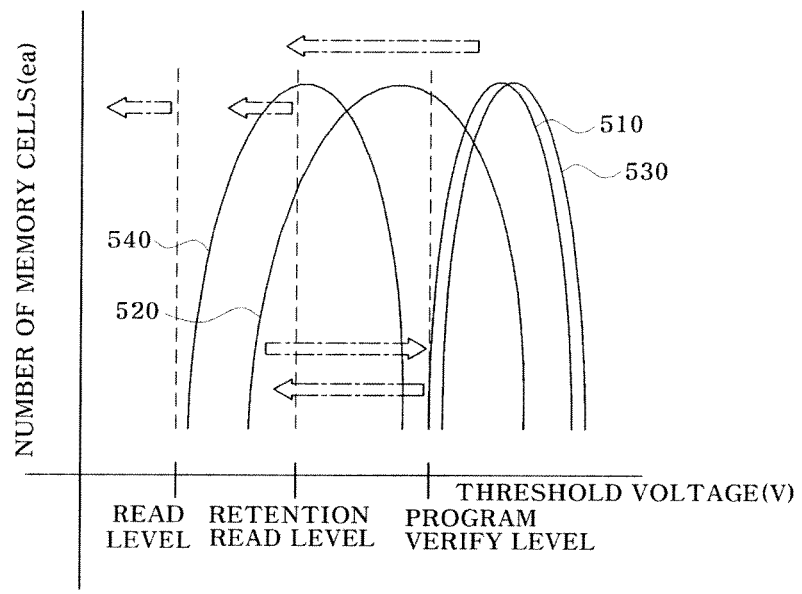
FIG. 5 illustrates a threshold voltage distribution of memory cells in the method for operating the charge trap flash memory device.
Figure 6:
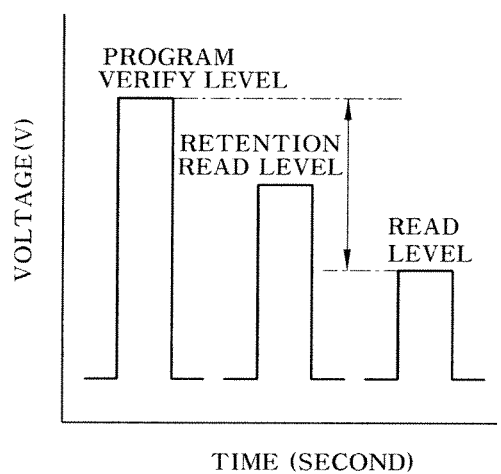
FIG. 6 illustrates a retention read level in the method for operating the charge trap flash memory device.
Figure 7:
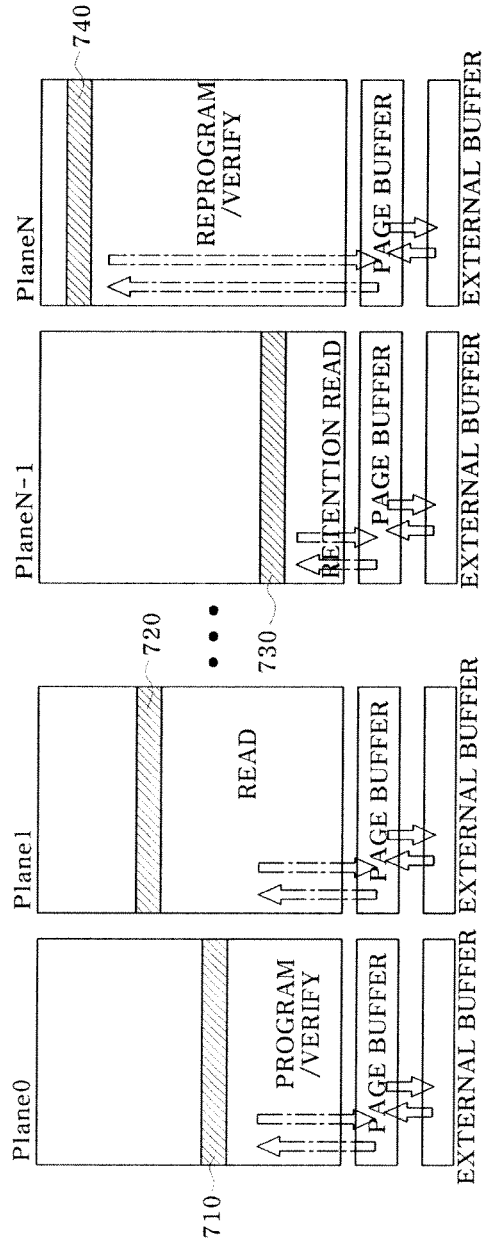
FIG. 7 illustrates the individual operations of a page and a block in the method for operating the charge trap flash memory device.

FIG. 4 illustrates a flowchart of a method for operating a charge trap flash memory device according to one example. FIG. 5 illustrates a threshold voltage distribution of memory cells in the method for operating the charge trap flash memory device. FIG. 6 illustrates a concept of a retention read level in the method for operating the charge trap flash memory device. FIG. 7 illustrates the individual operations of a page and a block in the method for operating the charge trap flash memory device.

At the step 410, memory cells are programmed by applying a predetermined program voltage (Vpgm). At the step 420, it is verified whether or not the programmed memory cells are programmed to an appropriate level. At this time, a verify voltage set to a predetermined level is used. At the step 430, when the memory cells are not programmed to the appropriate level (that is, the memory cells do not pass the verify step 420), the memory cells are programmed using an incremental step pulse programming (ISPP) scheme until they pass the verify step 420. That is, the program voltage is incremented by a step voltage (Vstep) with a predetermined level, and the memory cells are programmed until they pass the verify step 420. When the memory cells are programmed to the appropriate level, they have a threshold voltage distribution 510 as shown in FIG. 5.

At the step 440, when the memory cells are programmed to the appropriate level and thus pass the verify step 420, retention states of data programmed in the memory cells are verified after a certain time elapses. As described above, since electric charges trapped in the silicon nitride charge trapping layer are detrapped with the elapse of time, the threshold voltages of the memory cells are gradually lowered and have a threshold voltage distribution 520/540 as shown in FIG. 5. Therefore, when a read operation is performed after the completion of the program operation on the entire memory cells, the programmed memory cells are determined as being unprogrammed, thus causing a program fail. Therefore, it is necessary to perform an operation of verifying data retention states of the programmed memory cells after a certain time elapses and then recovering the threshold voltages of the memory cells.

To verify the data retention states of the memory cells, a retention read level is set to determine the upper limit of the threshold voltage, which is used as a reference to determine whether the memory cells pass the data retention verify step 440. As illustrated in FIGS. 5 and 6, the retention read level may be set to a level between the program verify level and the read level. The retention read level may be set to an appropriate level according to characteristics of the memory cells. Specifically, the retention read level may be set to a level ranging from the read voltage +10% of the read voltage to the program verify voltage −10% of the program verify voltage.

After the retention read level is set, the threshold voltage of the memory cell is compared with the retention read level. When the threshold voltage of the memory cell is lower than the retention read level, it is determined that the memory cell does not pass the verify step. On the other hand, when the threshold voltage of the memory cell is higher than the retention read level, it is determined that the memory cell passes the verify step.

At the steps 460 and 470, when the memory cell does not pass the verify step because its threshold voltage of the memory cell is lower than the retention read level (that is, the threshold voltage of the memory cell is lowered because electric charges are lost due to detrapping or the like), the corresponding memory cell is reprogrammed to have a threshold voltage higher than the set program verify level, as indicated by a reference numeral "530" as shown in FIG. 5. At this time, the operation of reprogramming the memory cell may be performed using an ISPP scheme. That is, the memory cell is programmed while incrementing the program voltage by a step voltage until it passes the program verify step 470. The program verify level may be set within the range of the verify level of the step 420 ±1.0 V.

At the step 450, when the threshold voltage of the memory cell is higher than the retention read level, data of the memory cell is read. At the step 480, it is determined whether the memory cell passes the program step, or fails the program step because it is not programmed to a desired level. Then, the program operation is terminated.

When a certain time elapses after the completion of the program operation, the threshold voltage of the programmed memory cell is confirmed. When the threshold voltage of the programmed memory cell is lower than a predetermined level, the corresponding memory cell is reprogrammed. In this way, it is possible to prevent a retention fail which is caused when the threshold voltage of the programmed memory cell is lowered by loss of electric charges.

Meanwhile, the operation for ensuring the retention margin may be individually performed on pages or blocks sharing the same page buffer. That is, while the typical program operation and program verify operation are performed on memory cells included in a page or block of a designated plane, the retention read operation and the reprogram operation may be performed on memory cells included in a page or block of another plane. For example, as illustrated in FIG. 7, while the program operation and program verify operation are performed on memory cells included in a page or block 710 of a plane 0, the operation of determining a program pass or fail is performed on a page or block 720 of another plane, e.g., a plane 1. The operation of determining whether to reprogram a memory cell is performed by performing a retention read operation on memory cells included in a page or block 730 of a plane N−1. The reprogram operation is performed on memory cells included in a page or block 740 of a plane N. Hence, it is possible to prevent the increase of an operating time of the device due to the operation of ensuring the retention margin.

The examples of the claimed invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for operating a charge trap flash memory device, the method comprising:
   programming a selected memory cell using a program voltage;
   first verifying the selected memory cell using a first program verify voltage;
   verifying data retention states of the selected memory cell using a retention verify voltage when the first verifying is passed;
   reading a cell data of the selected memory cell when the verifying data retention states is passed;
   determining a program pass or fail of the selected memory cell;
   reprogramming the selected memory cell when the verifying data retention states is not passed; and
   second verifying the reprogrammed selected memory cell using the second program verify voltage.

2. The method of claim 1, wherein the programming the selected memory cell is performed until the selected memory cell is passed the first verifying step using an incremental step pulse programming (ISPP) scheme.

3. The method of claim 1, wherein the retention verify voltage ranges from the first program verify voltage to the read voltage.

4. The method of claim 3, wherein the retention verify voltage ranges from the read voltage plus 10% of the read voltage to the first program verify voltage minus 10% of the first program verify voltage.

5. The method of claim 1, wherein the reprogramming the selected memory cell is performed until the selected memory cell is passed the second verifying the selected memory cell.

6. The method of claim 1, wherein the second program verify voltage ranges from the first program verify voltage minus 1.0 V to the first program verify voltage plus 1.0 V.

7. The method of claim 1, wherein the programming the selected memory cell, the first verifying the selected memory cell, the verifying data retention states of the selected memory cell, the reading the cell data of the selected memory cell and the determining the program pass or fail are individually performed on two or more planes sharing a single page buffer.

8. A method for operating a charge trap flash memory device, the method comprising:
   programming a selected memory cell using a program voltage;
   first verifying the selected memory cell using a first program verify voltage;
   verifying date retention states of the selected memory cell using a retention verify voltage when the first verifying is passed;
   reprogramming the selected memory cell when the verifying data retention states is not passed;
   second verifying the reprogrammed the selected memory cell using a second program verify voltage;
   reading a cell data of the selected memory cell when the second verifying the reprogrammed the selected memory cells is passed; and
   determining a program pass or fail of the selected memory cell.

9. The method of claim 8, wherein the programming the selected memory cell is performed until the selected memory cell is passed the first verifying step using an incremental step pulse programming (ISPP) scheme.

10. The method of claim 8, wherein the reprogramming the selected memory cell is performed until the reprogrammed selected memory cell is passed the second verifying the selected memory cell.

11. The method of claim 8, wherein the retention verify voltage ranges from the first program verify voltage to the read voltage.

12. The method of claim 11, wherein the retention verify voltage ranges from the read voltage plus 10% of the read voltage to the first program verify voltage minus 10% of the first program verify voltage.

13. The method of claim 8, wherein the programming the selected memory cell, the first verifying the selected memory cell, the verifying date retention states of the selected memory cell, the reprogramming the selected memory cell, the second verifying program states of the reprogrammed selected memory cell, and the determining a program pass or fail are individually performed on two or more planes sharing a single page buffer.

14. The method of claim 8, wherein the second program verify voltage ranges from the first program verify voltage minus 1.0 V to the first program verify voltage plus 1.0 V.

* * * * *